United States Patent [19]

Matsuda et al.

[11] 4,293,745

[45] Oct. 6, 1981

[54] CAPACITANCE TYPE CONTACT SWITCH

[75] Inventors: Takehiko Matsuda, Matsudo; Kyoichi Izawa, Tokyo, both of Japan

[73] Assignee: Toyostar Corporation, Tokyo, Japan

[21] Appl. No.: 45,755

[22] Filed: Jun. 5, 1979

[30] Foreign Application Priority Data

Jun. 23, 1978 [JP]   Japan .............................. 53/86265[U]

[51] Int. Cl.³ ........................................... H01H 35/00
[52] U.S. Cl. ............................ 200/52 R; 200/DIG. 1; 200/293; 361/288; 340/365 C
[58] Field of Search ................. 340/365 C; 200/52 R, 200/159 R, DIG. 1, 293; 400/479.1; 361/287, 288

[56] References Cited

U.S. PATENT DOCUMENTS 3,653,038  3/1972  Webb et al. ................... 200/DIG. 1
4,045,629  8/1977  Anzani .......................... 200/52 R
4,149,217  4/1979  Tucker .......................... 200/DIG. 1

FOREIGN PATENT DOCUMENTS 2712877  9/1978  Fed. Rep. of Germany ... 200/DIG. 1

OTHER PUBLICATIONS

Siemens, MSR/P 7707/19, Digital MOS Sensor-Dimmer with ICs 11/7/-7.

Primary Examiner—James R. Scott
Attorney, Agent, or Firm—Frishauf, Holtz, Goodman and Woodward

[57] ABSTRACT

A capacitance type contact switch has a conductive push button in the form of a bottomed cylinder which is slidably contained in first and second fitting members attached to a support plate. One end of a conductive spring member presses on the inside of a bottom portion of the push button to bias the push button toward the back of a front contact plate, while the other end of the spring member is in contact with a conductive seat member. An electrical circuit substrate contained in a switch case is connected to the seat member by means of a lead wire. Thus, electrical conduction may be provided between the contact plate and the electrical circuit substrate by means of the push button, spring member, seat member, and the lead wire. The switch is operated when a user touches the front contact plate to form a capacitance, the charging voltage of the capacitance being detected to control the switch in a manner known per se.

7 Claims, 6 Drawing Figures

CAPACITANCE TYPE CONTACT SWITCH

BACKGROUND OF THE INVENTION

This invention relates to a capacitance type contact switch for the control of electronic apparatus, capable of being operated by part of human body, e.g. a finger.

Recently, there have been developed for practical use electronic apparatus which employ a contact switch operated when touched by part of a human body, e.g. a finger, whereby switching of power supply of the apparatus may be controlled. The contact switch used with this type of electronic apparatus is so constructed that a capacitance may be formed between itself and a reference potential by a digital touch. By detecting charging voltage obtained by charging such capacitance, switching of the power supply may be controlled. These electronic apparatus using a contact switch are almost trouble-free and long-lived because they include no mechanical elements.

Prolonged use of such prior art contact switches may, however, lead to undesired interruption of electrical conduction, thus making them unreliable. Moreover, the conventional contact switch has a relatively complicated structure, involving difficulty in assembling.

SUMMARY OF THE INVENTION

It is therefore an object of this invention to provide a capacitance type contact switch capable of affording secure and steady electrical conduction and which is simple in construction, involving no difficulty in assembling.

In order to obtain the above object, a capacitance type contact switch according to this invention has a conductive push button in the form of a conductive bottomed cylinder which is slidably supported by a fitting means attached to a support plate. One end of a conductive spring member presses on the inside of a bottom portion of the bottomed cylinder of the push button to bias the push button toward the back of a conductive front contact plate, while the other end of the spring member is in contact with a conductive seat member. An electrical circuit substrate contained in a switch case is connected to the seat member by means of a lead wire. Thus, electrical conduction may be provided between the conductive contact plate and the electrical circuit substrate by means of the push button, spring member, seat member, and the lead wire.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DETAILED DESCRIPTION OF THE PREFERRED EMBODIMENT

Figure 1:
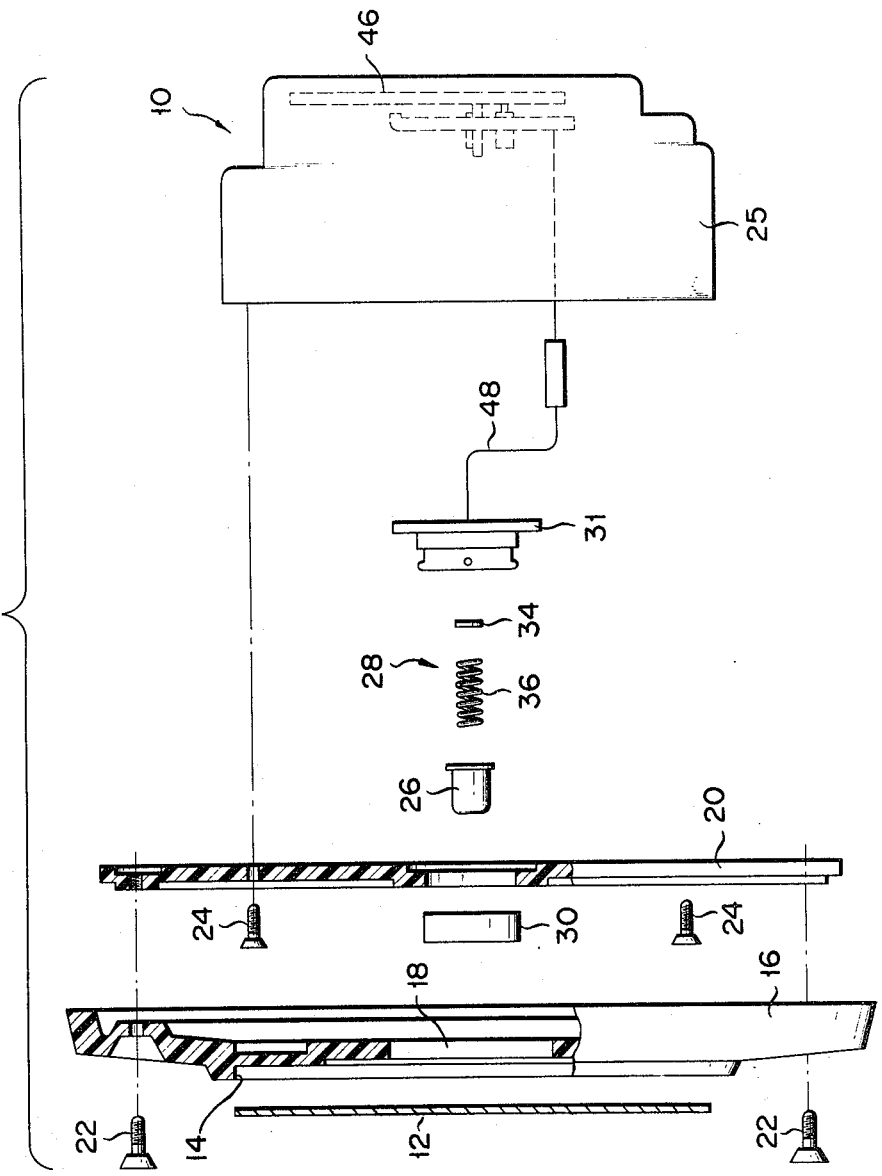
FIG. 1 is a perspective view showing the main components of a contact switch according to this invention.

As may be seen from FIG. 1 showing the main components of a capacitance type contact switch 10 according to this invention, the contact switch 10 comprises a front contact plate 12 formed of conductive material such as aluminum. The conductive contact plate 12 forms a capacitance with the reference potential when touched by part of a human body, e.g. a finger. The contact plate 12 is fitted in a front frame 14 of a front panel 16 formed of insulating material such as plastic, and adhered thereto with an adhesive. A through hole 18 is bored in the center of the front panel 16 behind the contact plate 12. A support plate 20 is attached to the back of the front panel 16 by means of a pair of screws 22, while the support plate 20 is attached to a switch case 25 by means of a pair of screws 24.

Figure 2:
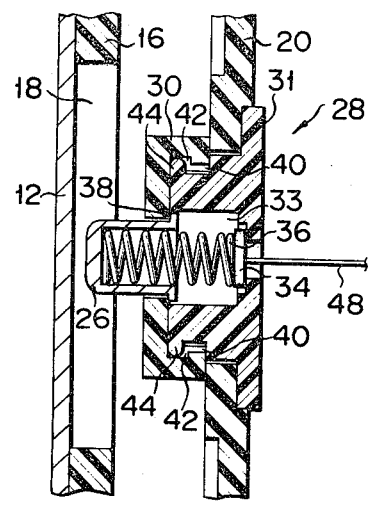
FIGS. 2 and 4 are partially enlarged sectional views showing states before and after a front 16 is attached to a support plate 20, respectively.

As clearly shown in FIG. 2 a fitting means 28 containing a push button 26 biased toward the back of the front contact plate 12 is attached to the support plate 20. Fitting means 28 includes first and second fitting members 30 and 31 respectively having central through holes 32 and 33, the central hole 33 of the second fitting member 31 being stepped. At the step portion of the central hole 33 is a, for example, circular seat member 34 on which a spring member 36 such as a compression coil spring contained in the central holes 32 and 33 presses to bias the push button 26 toward the back of the contact plate 12. Both the seat member 34 and the spring member 36 are formed of conductive material. The push button 26 preferably has a flange 38 for preventing it from coming off of member 30, and the first fitting member 30 is in the form of a cylinder with a bottom portion which serves as a stop to engage the flange 38.

Figure 3:
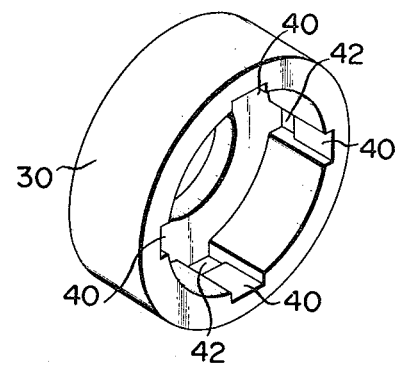
FIG. 3 is an enlarged perspective view of a first fitting member.

The fitting means 28 is assembled and attached to the support plate 20 by snap-fastening so as to hold the support plate 20 between the first and second fitting members 30 and 31, without using screws or any other coupling means for ease of assembling. For the purpose of such snap-fastening, the fitting member 30 has on its inner peripheral surface a plurality of, e.g. four, axial guide grooves 40 and engaging recesses 42 as many as the guide grooves 40 communicating therewith (FIG. 3). On the other hand, the second fitting member 31 has on its outer peripheral surface projections 44 as many as the guide grooves 40. These projections 44 are elastically deformed inward in the radial direction to move along the guide grooves 40 when the second fitting member 31 is inserted into the first fitting member 30 to be put together therewith. Snap-fastening of the first and second members 30 and 31 can be achieved with the deformed projections 44 restored to be trapped in the engaging recesses 42. To ensure the radially inward elastic deformation of the projections 44, the second fitting member 31, as well as the first fitting member 30, is formed of elastically deformable material such as, for example, acrylic resin.

The switch case 25 fitted with the support plate 20 by means of the screws 24 contains an electrical circuit substrate 46 on which a resistance element, electrodes, etc. are mounted. A lead wire 48 extending from the electrical circuit substrate 46 is connected to the seat member 34.

Figure 4:
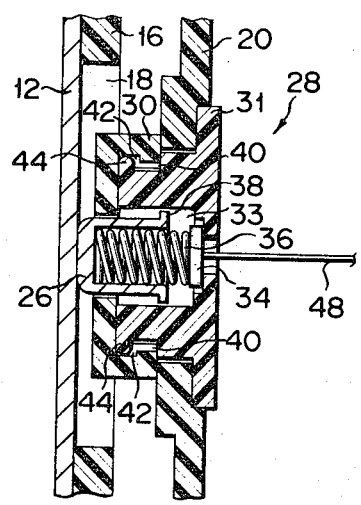

The contact switch 10 according to this invention is assembled in the following manner. The seat member 34 is disposed at the step portion of the central hole 33 of the second fitting member 31, one end of the spring member 36 engaging the seat member 34. The push button 26 is put on the other end of the spring member 36. Then, as shown in FIG. 2, the first and second fitting members 30 and 31 are pressed against each other with the support plate 20 therebetween and with the projections 44 in alignment with the guide grooves 40 of the first fitting member 30 until the projections 44 get trapped in the engaging recesses 42. When the projections 44 are trapped in the engaging recesses 42, the first and second fitting members 30 and 31 are attached to the support plate 20, holding the support plate 20 between them. In this state, the push button 26 is biased by the spring member 36 to protrude outward. Hereupon, the flange 38 of the push button 26 is pushed against the inside of the bottom portion of the first fitting member 30, thereby preventing the push button 26 from coming off. Then, the support plate 20 is attached to the switch case 25 by means of the pair of screws 24. Further, the front panel 16 previously, having the contact plate 12 adhered thereto, is attached to the support plate 20 by means of the screws 22. In this state, the push button 26 is in touch with the back of the contact plate 12, and the spring member 36 is partially compressed, as shown in FIG. 4. The push button 26 is pressed against the back of the contact plate 12 and floatingly sustained under biasing force created by the partially compressed spring member 36, so that the contact between the back of the contact plate 12 and the push button 26 is in an optimum condition. Thus, there is formed an electrical path consisting of the contact plate 12, push button 26, spring member 36, seat member 34, and the lead wire 48, through which a signal applied to the contact plate 12 by digital touch is transmitted to the electrical circuit substrate 46.

Figure 5:
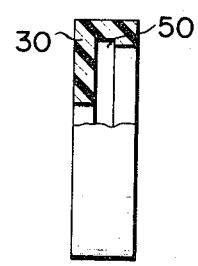
FIG. 5 is a broken side view showing a modification of the first fitting member.
Figure 6:
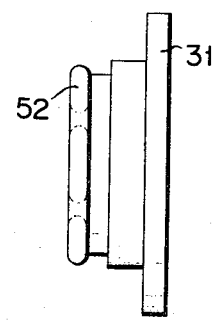
FIG. 6 is a side view showing a modification of a second fitting member.

The snap-fastening of the first and second fitting members 30 and 31 may be achieved also by trapping projection 52 (FIG. 6) formed on the entire outer peripheral surface of the second fitting member 31 in an annular engaging recess 50 (FIG. 5) formed on the inner peripheral surface of the first fitting member 30. The projection 52 need not cover the whole circumference but may be only sectional as indicated by chain lines.

As described above, the contact switch 10 according to this invention comprises the conductive contact plate 12, the conductive push button 26 in the form of a bottomed cylinder slidably supported by the fitting means 28 attached to the support plate 20, and the conductive spring member 36 with one end pressing on the inside of the bottom portion of the push button 26 to bias the push button 26 toward the back of the contact plate 12 and having the other end in contact with the conductive seat member 34. The push button 26, spring member 36 and seat member 34 are all contained in the fitting means 28. The contact switch 10 further comprises the switch case 25 fitted with the support plate 12 and containing the electrical circuit substrate 46 connected to the seat member 34 by means of the lead wire 48. In the contact switch 10 of the invention, the push button 26 is biased toward the back of the contact plate 12 by the spring member 36, while the push button 26, spring member 36, contact plate 12, and the seat member 34 are all formed of conductive material, and the conductive seat member 34 in touch with the spring member 36 is connected with the electrical circuit substrate 46 by means of the lead wire 48. Thus, there may be provided secure and steady electrical conduction between the contact plate 12 and the electrical circuit substrate 46. Since the spring member 36 is interposed between the push button 26 and the seat member 34 to bias the push button 26 toward the front contact plate 12, the contact switch 10 may be simple in construction, ensuring easy assembling. Moreover, the push button 26, spring member 36 and seat member 34 are housed in the fitting means 28 with the first and second fitting members 30 and 31 snap-fastened to each other to hold the support plate 20 therebetween, so that the assembling of the contact switch 10 may further be facilitated.

It is further understood by those skilled in the art that the foregoing description is a preferred embodiment of the disclosed device and that various changes and modifications may be made in the invention without departing from the spirit and scope thereof.

What we claim is:

1. A capacitance type contact switch comprising:
   a conductive front contact plate mounted to a front panel,
   a support plate attached to said front panel,
   fitting means attached to said support plate and containing a conductive push button in the form of a conductive bottomed cylinder, a conductive seat member, and a conductive spring member interposed between said bottomed cylinder of said push button and said seat member and biasing said push button toward the back of said front contact plate,
   a switch case coupled to said support plate and containing an electrical circuit substrate, and
   lead wire means electrically connecting said electrical circuit substrate with said seat member, thereby providing electrical conduction between said substrate and said conductive contact plate through said seat member, spring member and push button.

2. A capacitance type contact switch according to claim 1, wherein:
   said bottomed cylinder of said push button has a flange; and
   said fitting means includes a first fitting member having a stop which is engaged by the flange of said push button to prevent said push button from coming off of said fitting member, and a second fitting member snap-fastened to said first fitting member to cooperate with said first fitting member to hold said support plate.

3. A capacitance type contact switch according to claim 1 or 2, wherein:
   said first fitting member is a bottomed cylinder with a bottom portion serving as a stop, said first fitting member having a plurality of axial guide grooves on the inner peripheral surface thereof and engaging recesses of the same number as said guide grooves communicating with said guide grooves; and
   said second fitting member has a central stepped hole containing said push button and having a step portion against which said seat member is pushed by said spring member, and a plurality of projections on the outer peripheral surface thereof to be trapped in said engaging recesses of said first fitting member via said guide grooves, whereby said second fitting member is snap-fastened to said first fitting member.

4. A capacitance type contact switch according to claim 1 or 2, wherein:

said first fitting member is a bottomed cylinder with a bottom portion serving as a stop, said first fitting member having an annular engaging recess on the inner peripheral surface thereof; and said second fitting member has a central stepped hole containing said push button and having a step portion against which said seat member is pushed by said spring member, and a projection on the outer peripheral surface thereof to be trapped in said engaging recess of said first fitting member, whereby said second fitting member is snap-fastened to said first fitting member.

5. A capacitance type contact switch according to claim 2, wherein said first and second fitting members cooperate to hold said support plate between said first and second fitting members.

6. A capacitance type contact switch according to claim 3, wherein said plurality of projections of said second fitting member are elastically deformable so as to travel along said axial guide grooves in an elastically deformed state, and to be restored to be trapped in said engaging recesses after passing through said guide grooves.

7. A capacitance type contact switch according to claim 4, wherein said projection on the outer peripheral surface of said second fitting member is elastically deformable to snap fasten in said annular engaging recess of said first fitting member.

* * * * *